United States Patent [19]

Guha et al.

[11] Patent Number: 4,555,586
[45] Date of Patent: Nov. 26, 1985

[54] PHOTOVOLTIAC DEVICE HAVING LONG TERM ENERGY CONVERSION STABILITY AND METHOD OF PRODUCING SAME

[75] Inventors: Subhendu Guha, Clawson; William DenBoer, Troy, both of Mich.

[73] Assignee: Energy Conversion Devices, Inc., Troy, Mich.

[21] Appl. No.: 637,984

[22] Filed: Aug. 6, 1984

[51] Int. Cl.[4] .............................................. H01L 31/06
[52] U.S. Cl. .................................... 136/259; 136/251; 136/258; 136/290; 357/30; 29/572
[58] Field of Search ....... 136/246, 248, 251, 258 AM, 136/259, 290; 357/30; 29/572

[56] References Cited

U.S. PATENT DOCUMENTS 3,597,281  8/1971  Webb .................................... 136/245
4,409,424  10/1983  Devaud ........................ 136/258 AM

OTHER PUBLICATIONS

W. Krühler, *Proceedings 4th E.C. Photovoltaic Solar Energy Conf.*, (1982), Reidel Publishing Co. (1982), pp. 754–758.

T. D. Monstakas et al., *Appl. Phys. Lett.*, vol. 43, pp. 368–370, (1983).

Primary Examiner—Aaron Weisstuch
Attorney, Agent, or Firm—Marvin S. Siskind; Ronald W. Citkowski

[57] ABSTRACT

A photoresponsive device characterized by the capability of having photoinduced defects annealed out of the photoactive region thereof in a low temperature process. Low temperature annealability is provided by including small amounts of dopant material in the photoactive region of the semiconductor material of the device. More particularly, the incorporation of small amounts of a p-dopant, such as boron, into the intrinsic region of a p-i-n photovoltaic device lowers the annealing temperature thereof. Such low temperature annealable photovoltaic devices may be incorporated into modules designed to operate at temperatures sufficient to remove said light induced defects, thereby providing a photovoltaic module exhibiting long term stability in its energy conversion efficiency.

29 Claims, 6 Drawing Figures

PHOTOVOLTIAC DEVICE HAVING LONG TERM ENERGY CONVERSION STABILITY AND METHOD OF PRODUCING SAME

FIELD OF THE INVENTION

This invention relates generally to photoresponsive devices and more particularly to thin film photovoltaic devices in which light induced defects may be removed therefrom by annealing at relatively low temperatures. The instant invention is particularly adapted for the fabrication of single or stacked thin film p-i-n type photovoltaic devices which exhibit long term stability in energy conversion efficiency.

BACKGROUND OF THE INVENTION

According to the principles of the instant invention, there are disclosed herein improved photovoltaic devices which exhibit long term stability in the operating efficiency thereof and a method for the fabrication of said improved photovoltaic devices. That is to say, the photovoltaic devices of the instant invention are specifically designed so as to retain their initial operating efficiency (i.e., retain the percentage of incident photon energy converted to electrical energy) throughout their operating life, vis-a-vis, photovoltaic devices which degrade under the influence of incident photon energy due to "Staebler-Wronski effects", as will be fully explained hereinafter.

Recently, considerable efforts have been made to develop systems for depositing amorphous semiconductor materials, each of which can encompass relatively large areas, and which can be doped to form p-type and n-type materials for the production of p-i-n and n-i-p type photovoltaic devices which are, in operation, substantially equivalent to their crystalline counterparts. It is to be noted that the term "amorphous", as used herein, includes all materials or alloys which have no long range order, although they may have short or intermediate range order or even contain, at times, crystalline inclusions.

It is now possible to prepare amorphous silicon alloys by glow discharge or vacuum deposition techniques, said alloys possessing (1) acceptable concentrations of localized defect states in the energy gaps thereof, and (2) high quality electrical and optical properties. Such deposition techniques are fully described in U.S. Pat. No. 4,226,898, entitled Amorphous Semiconductors Equivalent To Crystalline Semiconductors, issued in the names of Stanford R. Ovshinsky and Arun Madan on Oct. 7, 1980; U.S. Pat. No. 4,217,374, issued in the names of Stanford R. Ovshinsky and Masatsugu Izu on Aug. 12, 1980, also entitled Amorphous Semiconductors Equivalent To Crystalline Semiconductors; and U.S. Pat. No. 4,517,223, issued in the names of Stanford R. Ovshinsky, David D. Allred, Lee Walter, and Stephen J. Hudgens on May 14, 1985 and entitled Method Of Making Amorphous Semiconductor Alloys And Devices Using Microwave Energy. As disclosed in these patents, which are assigned to the assignee of the instant invention and the disclosures of which are incorporated by reference, fluorine introduced into the amorphous silicon semiconductor layers operates to substantially reduce the density of the localized defect states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498, issued on Aug. 16, 1960. The multiple cell structures therein disclosed utilized p-n junction crystalline semiconductor devices. Essentially, the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. However, it is virtually impossible to match crystalline lattice constants as is required in the multiple cell structures of the prior art. Therefore, tandem cell structures cannot be practically fabricated from crystalline materials in a manner which would have commercial production potential. As the assignee of the instant invention has shown, however, such tandem cell structures are not only possible, but can be economically fabricated in large areas by employing amorphous materials.

The multiple cells preferably include a back reflector for increasing the percentage of incident light reflected from the substrate back through the semiconductor layers of the cells. It should be obvious that the use of a back reflector, by increasing the use of light entering the cell, increases the operational efficiency of the multiple cells. Accordingly, it is important that any photoresponsive layer of semiconductor material deposited atop the light incident surface of the substrate be transparent so as to pass a high percentage of incident light from the reflective surface of the back reflector through the photogenerative layers of semiconductor material of the cell(s).

Unlike crystalline silicon which is limited to batch processing for the manufacture of solar cells, amorphous silicon alloys can be deposited in multiple layers over large area substrates to form solar cells in a high volume, continuous processing system. Such continuous processing systems are disclosed in the following U.S. patents and pending application: U.S. Pat. No. 4,400,409, for A Method Of Making P-Doped Silicon Films And Devices Made Therefrom; U.S. Pat. No. 4,410,588, for Continuous Amorphous Solar Cell Production System; U.S. Pat. No. 4,438,723, for Multiple Chamber Deposition And Isolation System And Method; application Ser. No. 244,386, filed Mar. 16, 1981, for Continuous Systems For Depositing Amorphous Semiconductor Material; U.S. Pat. No. 4,492,181, for Method And Apparatus For Continuously Producing Tandem Amorphous Photovoltaic Cells; and U.S. Pat. No. 4,485,125, for Method and Apparatus For Continuously Producing Tandem Amorphous Photovoltaic Cells. As disclosed in these patents and application, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. Since each deposited semiconductor alloy, and especially the intrinsic semiconductor alloy, must be of high purity, every possible precaution is taken to insure that the sanctity of the vacuum envelope formed by the various chambers of the deposition apparatus remains uncontaminated by impurities, regardless of origin.

The layers of semiconductor alloy material thus deposited in the vacuum envelope of the deposition apparatus may be utilized to form photoresponsive devices, such as, but not limited to, photovoltaic cells which include one or more p-i-n cells or one or more n-i-p cells, Schottky barriers, photodiodes, phototransistors, or the like. Additionally, by making multiple passes through the succession of deposition chambers, or by providing an additional array of deposition chambers, multiple stacked cells of various configurations may be obtained.

As should be apparent from the foregoing, thin film amorphous semiconductor materials offer several distinct advantage over crystalline materials, insofar as they can be easily and economically fabricated into large area photoresponsive devices by newly developed mass production processes. However, heretofore produced amorphous silicon based semiconductor materials from which photovoltaic devices were fabricated, proved prone to degrade as a result of prolonged exposure to light, especially during the operation thereof. This process, termed "photodegradation", or "Staebler-Wronski degradation" (mentioned hereinabove), although not fully understood, is believed to be due to the fact that long-term exposure of the amorphous semiconductor material to a photon flux tends to break weak bonds between the constituent atoms of the semiconductor material, thereby resulting in the formation of defect states in the band gap, such as dangling bonds, which are detrimental to the photovoltaic efficiency of a photoresponsive device from which degraded semiconductor material said photoresponsive device is fabricated. It has heretofore been observed that photogenerated defects may be annealed out of a sample of degraded semiconductor material by exposing said sample to elevated temperatures for a prolonged period of time; for example, a temperature of approximately 150° degrees for several hours. In such a manner, samples of semiconductor material, thus degraded by operational exposure to light and subsequently annealed, may be restored to approximately the same level of photovoltaic performance which they exhibited prior to said operational degradation.

While somewhat parodoxical, it appears true that the higher the initial (pre-operational) quality of the semiconductor material from which a photovoltaic device is fabricated, (1) the greater the effect of photodegradation thereupon, and (2) the greater the operation-dependent loss in efficiency exhibited by said photovoltaic device incorporating such higher quality semiconductor materials. One possible explanation for this apparent parodox is that lower quality photovoltaic semiconductor material initially includes a relatively high number of defect states in the energy gap thereof and consequently, the formation of additional defect states in the energy gap thereof via the aforedescribed photodegradation process is not as significant as the formation of additional defect states is for a higher quality semiconductor material which is initially characterized by a relatively low number of defect states. Because of the fact that the assignee of the instant invention is now able to commercially manufacture high quality photovoltaic semiconductor materials exhibiting said low initial density of defect states in the energy gaps thereof, in a high volume, continuous production process; the problem of photodegradation of photovoltaic devices fabricated therefrom has become increasingly significant. As should be apparent, the practical ramification of significant operational losses in efficiency is to prevent the consuming public from purchasing photovoltaic energy generating systems (significant operational losses, for purposes of the instant application, will refer to losses upwards of 20% efficiency over the operating lifetime thereof).

Heretofore, the deleterious effects of photodegradation were dealt with by either (1) annealing the semiconductor material at relatively high temperatures for prolonged periods of time in order to remove the defect states in the energy gap thereof and restore the electrical generating capacity thereof to its original value, or (2) ignoring the defect states and allowing the semiconductor material to operate at less than full efficiency. Neither of the aforementioned options provides a commercially acceptable result which would stimulate consumer confidence and promote consumer purchasing of photovoltaic devices fabricated from that semiconductor material.

As to the first option, several methods of annealing have been employed. In one method the annealing procedure is instituted on a cyclic basis wherein the semiconductor material is periodically, typically at an interval of several months to a couple of years, heated to an elevated temperature for a period of time sufficient to substantially reduce the defect states present in the energy gap thereof and thereby substantially restore the initial photoconversion efficiency of the photovoltaic device which incorporates that degraded semiconductor material. The heating may be carried out in situ by incorporating a heat source in the photovoltaic installation itself, or the degraded semiconductor material may be removed from its installation and heated in an oven. Heating temperatures for such periodic annealing processes are typically 150° C. or greater and the semiconductor material is maintained at that elevated temperature for at least a period of two hours.

In an alternative annealing process, the semiconductor material is continuously annealed by incorporating said material into a solar collector panel, (said collector panel referred to hereinafter as a "hot module") which panel is adapted to collect and retain the solar thermal energy incident thereupon. In such a solar heating arrangement, the semiconductor material is maintained, during normal operation, at an elevated annealing temperature (typically in excess of 100° C.) and the defect states in the energy gap of the semiconductor material are annealed substantially simultaneously with the formation thereof. Depending upon the temperature maintained by the hot module during the operation of the photovoltaic device, the photodegradation of the semiconductor material can thereby be prevented or at least substantially reduced. Such methods and techniques of continuous high temperature annealing are disclosed in U.S. patent application Ser. No. 636,172 fo Vincent D. Cannella entitled, "Photovoltaic Panel Having Enhanced Conversion Efficiency Stability", filed July 31, 1984 and assigned to the assignee of the instant invention, the disclosure of which application is incorporated herein by reference.

While the use of the prior art high temperature annealing processes herein described do result in the substantial removal of photoinduced defects, the elevated temperatures required by said prior art processes impose limitations upon their utilization, and it is therefore desirable to lower the annealing temperature required to effect a substantial reduction in the number of photoinduced defect states in the energy gap of the semiconductor material. More particularly, in photovoltaic devices high annealing temperatures can result in damage to the busbars, grid patterns, and electrical circuitry associated with the photovoltaic device or the modules fabricated from a number of photovoltaic devices. Further, structures upon which the photovoltaic device or photovoltaic modules are deployed, such as roof tops, are readily susceptible to high temperature damage. Also, where continuous annealing processes, as described hereinabove, are employed, the design of the hot module may be greatly simplified if the annealing temperatures can be reduced.

As mentioned supra, in the second alternative of dealing with photoinduced defects, the amorphous photovoltaic devices which incorporate the semiconductor material may simply be allowed to photodegrade. The rate of photodegradation for a particular photovoltaic device configuration may be readily ascertained, and the power requirement for a given installation may therefore be readily specified to account for the degree of photodegradation expected during the operational life forecasted for the photovoltaic devices. For example, a particular photovoltaic device may be predicted to degrade to 80% of its initial electrical performance within a period of 10 years of operation; therefore, an excess capacity in electrical performance of the photovoltaic device of 20% may be incorporated in the initial installation to account for this subsequent loss or degradation. While such an approach is relatively simple and may be acceptable for a variety of photovoltaic installations, it obviously represents an inadequate solution to the problem (since it merely addresses the result and not the problem), and represents an intolerable solution for many other uses. In photovoltaic installations in which space for solar collection and electrical generation is at a premium, it is necessary to have the photovoltaic devices operate at peak efficiency at all times. In other photovoltaic installations reliability and consistency of electrical power generated by and delivered from the devices is required. In the latter type of installations, the photovoltaic devices must be fabricated from semiconductor material which is relatively consistent in its conversion efficiency throughout the expected operational lifetime thereof, i.e., minimum degradation over a 20 year period of time.

As previously stated, the mechanism of photodegradation of amorphous photovoltaic semiconductor materials is not fully understood; however, it is believed that said photodegradation involves the continuous production of a wide distribution of defect states in the band gap of the semiconductor material during operation of the photovoltaic device incorporating that semiconductor material. The term "defects", or "defect states", as generally used by routineers in the field of amorphous semiconductor materials, and as used herein, is a broad term generally including all deviant atomic configurations such as: broken bonds, dangling bonds, bent bonds, strained bonds, vacancies, microvoids, etc.

In a photovoltaic device, a charge carrier pair (i.e. an electron and a hole) is generated in response to the absorption of photons from incident radiation in the photoactive region of the semiconductor material thereof. Under the influence of an internal electrical field established by the doped layers of semiconductor material of the photovoltaic device, such as a solar cell, the charge carriers are drawn toward opposite electrodes of the cell causing the positively charged holes to collect at the negative electrode and the negatively charged electrons to collect at the positive electrode thereof. Under ideal operating conditions, every photogenerated charge carrier would be conducted to its respective collection electrode. However, operating conditions are not ideal and losses in the collection of photogenerated charge carriers occur to some degree in all photovoltaic devices. Note that the primary loss in charge carrier collection is due to charge carrier recombination, wherein an electron and a hole drifting through the semiconductor material toward an electrode of the photovoltaic device, find one another and reunite. Obviously, charge carriers that reunite or recombine are not available for electrode collection and the resultant production of electrical current. The aforementioned defects or defect states that occur in the photoactive region of the semiconductor material of the photovoltaic device provide recombination centers which facilitate the reunion and recombination of electrons and holes. Therefore, the more defects or defect states that are present in the semiconductor material of a device, the higher the rate of charge carrier recombination therein. Accordingly, charge carrier collection efficiency decreases as the rate of charge carrier recombination increases within the photoactive region of a given semiconductor material. Therefore, an increase in the number of defect states is at least partially responsible for an increase in the rate of charge carrier recombination and a concomitant decrease in the conversion efficiency of photovoltaic devices.

A further and different approach to the problem of photodegradation of thin film amorphous photovoltaic devices is disclosed in U.S. patent application Ser. No. 623,860 filed June 25, 1984 and entitled Stable Photovoltaic Devices and Method of Producing Same, which application is assigned to the Assignee of the instant invention and the disclosure of which is incorporated herein by reference. As disclosed therein, the semiconductor material of a photovoltaic device may be provided with a graded (i.e. varying) band gap in the photoactive region thereof, such that the widest band gap portion of that region is most proximate the light incident surface of the device and the narrowest band gap region thereof is distal of the light incident surface. In this manner, light will be absorbed more uniformly throughout the photoactive region of the semiconductor material resulting in a more uniform distribution of photogenerated carrier pairs throughout that photoactive region. A photovoltaic device, thus configured, is more tolerant of photoinduced defects, that is to say, the electrical output of the device will not be as severely degraded by the addition of photoinduced defects as that of a non-band gap graded photovoltaic device. It should be noted that while the band gap graded photovoltaic devices of the aforementioned application do not exhibit a lower number of light induced defects, the effect of the photoinduced defects on the operational efficiency of the devices is reduced by preventing a concentration of charge carriers adjacent the light incident surface thereof.

In contradistinction thereto, the instant invention relates to photovoltaic devices in which high operating efficiency is assured throughout the operational lifetime thereof by either (1) continuously or (2) periodically annealing out photoinduced defects at a relatively low and easily obtainable temperature. Therefore, the instant invention and application Ser. No. 623,860 are complementary. That is to say, they may be used in conjunction with one another to provide photovoltaic devices which not only exhibit low rates of photoinduced defect formation, but which also are characterized by the ability to continuously remove the effects of photoinduced defects which are formed through the innocuous vehicle of low temperature annealing.

As alluded to hereinabove, the instant invention relates to photovoltaic devices from which light induced defects may be annealed at relatively low temperatures. Such a low temperature annealing feature is provided in the devices by including small amounts of an annealing temperature reducing material, typically a dopant material, in the layer or layers of semiconductor material which form the photoactive (charge carrier generating) region of the device. In a typical p-i-n or n-i-p solar cell, formed of an amorphous silicon, or an amorphous silicon-germanium alloy, the inclusion of small amounts of a dopant material, such as boron, in the intrinsic semiconductor layer thereof has been found to lower the annealing temperature of said cells to 100° C. or lower. This will be described in greater detail hereinbelow. In photovoltaic devices so configured, it becomes possible to substantially remove photoinduced defects by periodically heating the devices to temperatures of approximately 100° C. for times of approximately fifteen minutes to one hour.

Alternatively, photovoltaic devices fabricated in accordance with the principles of the instant invention may be maintained in the continuous annealing mode of operation. It has been found that temperatures of as low as approximately 60° C. are sufficient to anneal out photoinduced defects substantially as they form. Therefore, according to the principles of the instant invention, it is possible to fabricate a hot module type of photovoltaic device of relatively simple design, the semiconductor material of which will exhibit substantially no photoinduced degradation throughout the operational life thereof.

The literature has heretofore noted that the addition of boron to the layer of intrinsic semiconductor material of an amorphous silicon p-i-n type photovoltaic device resulted in an improved resistance to the formation of light induced defects therein; see for example, "Light Induced Instability of Amorphous Silicon Photovoltaic Cells" by S. Tsuda, et al, *Solar Cells*, 9 (1983) 25–36 and "Stability of P-I-N Hydrogenated Amorphous Silicon Solar Cells to Light Exposure" by Y. Uchida, et al *Solar Cells*, 9 (1983) 3–12. While it has been reported in the foregoing papers that the addition of relatively small amounts of boron to the layer of intrinsic semiconductor material of a p-i-n photovoltaic device improves the stability of said device, both of those papers specifically as well as the prior art, generally, have failed to recognize that dopant materials may be employed to lower the temperature at which light induced defects can be annealed out of the semiconductor material. It should further be noted that the doping levels employed by Tsuda and Uchida are generally lower than those utilized in the practice of the instant invention. Any improvement in the operational efficiency of photovoltaic devices produced in accordance with the methodology of Tsuda or Uchida is attributable to a change in the field profile of the photoactive region of the semiconductor material thereof which results from the addition of boron thereinto. Accordingly, the claimed improvement of Tsuda and Uchida's devices is attributable to the particular configuration of the devices (p-i-n, for example). Simply stated, the improvement is a device property, vis-a-vis, a material property (as is the improvement invented and described by Applicants herein).

More particularly, the instant invention effects an improvement in properties of the bulk photoactive region of the semiconductor material itself. In accordance therewith, there is disclosed by the instant invention, a semiconductor material which is specially designed so as to be provided with the capability of having light induced defect states in the energy gap thereof annealed therefrom at heretofore unattainable low temperatures. Furthermore, and in contradistinction to the Tsuda and Uchida work, the annealing properties of the semiconductor material are attained independently of the electrical field profile or any other device-related property. Additionally, the instant invention provides semiconductor material for the photoactive region of a photovoltaic device which is capable of annealing out a substantial percentage of light induced defects therefrom at low temperatures, while the device is operating. Therefore, such a device may be said to be essentially "self-healing" with regard to light induced defects, and is characterized by long term stability in the energy conversion efficiency thereof.

It may thus be seen that the instant invention has great utility insofar as it provides for the fabrication of a photovoltaic device from semiconductor material in which light induced defects are readily removed in a low temperature annealing process. The semiconductor material of such a photovoltaic device is readily restored from a lowered efficiency, photodegraded state to substantially, its initial operational state by a simple, energy efficient thermal annealing process which does not necessitate the use of relatively high temperatures capable of (1) damaging the underlying structures upon which the photovoltaic devices are deployed, or (2) harming personnel in the vicinity. Additionally, the low temperature annealable semiconductor material of the photovoltaic device can be readily adapted to a continuous annealing process by disposing the photovoltaic device in a module capable of operation at temperatures only slightly above ambient temperature.

Other objects and advantages of the instant invention will be more fully explained with reference to the Figures, the Detailed Description of the Invention and the claims which follow.

BRIEF DESCRIPTION OF THE INVENTION

There is disclosed herein a photoresponsive device fabricated from semiconductor material adapted to (1) generate electron hole pairs in a photoactive region thereof in response to incident light; (2) collect the electrons and holes; (3) develop light induced defects tending to deleteriously affect collection efficiency and (4) remove a substantial number of said light induced defects by annealing at elevated temperatures. The improved semiconductor material from which the photovoltaic device of the instant invention is fabricated includes means for substantially reducing the temperature at which the light induced defects can be annealed and means for maintaining said semiconductor material at the reduced annealing temperature for at least a portion of its operational lifetime. In this manner, the light induced defects are at least periodically annealed out of the photoresponsive region of the semiconductor material of the photovoltaic device during the operation thereof, so as to provide an improved photovoltaic device characterized by a relatively stable collection efficiency.

Reduction of the annealing temperature to the level which is necessary to remove photoinduced defects is accomplished by including an annealing temperature reducing material in at least a portion of the photoactive region of the semiconductor material of the photoresponsive device. In one preferred embodiment, the device is a p-i-n type photovoltaic device in which the photoactive region formed in the layer of intrinsic semiconductor material thereof is fabricated of an amorphous silicon or an amorphous silicon:germanium alloy, and the reduction of the annealing temperature is accomplished by incorporating small amounts of p-doping material, such as boron, aluminum, gallium, indium, thallium, and combinations thereof in that intrinsic layer of photoactive semiconductor material.

In one particular embodiment of the instant invention, the semiconductor material of the photovoltaic device is periodically raised to its annealing temperature by an electrical heater which is operatively associated therewith. In another embodiment, the photovoltaic device includes a thermally insulated module which retains solar thermal energy incident thereupon to either (1) periodically raise the semiconductor material to its annealing temperature or (2) constantly maintain the semiconductor material at its annealing temperature.

The instant invention may be readily adapted for the fabrication of stacked tandem p-i-n, n-i-p or p-n photovoltaic cells in which one or more of the p-i-n, n-i-p or p-n subcells thereof are provided with a lightly doped photoactive region of semiconductor material so as to reduce temperature required to anneal light induced defects therefrom. Also disclosed herein is a method for the fabrication of such photovoltaic devices.

DETAILED DESCRIPTION OF THE DRAWINGS

I. The Photovoltaic Device

Figure 1:
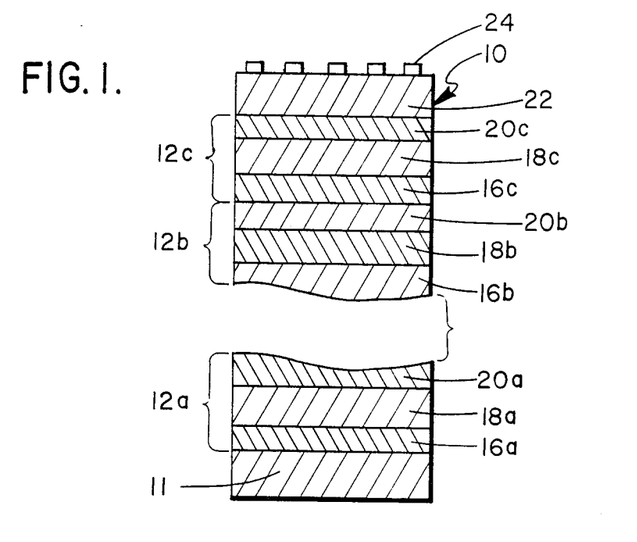
FIG. 1 is a fragmentary, cross-sectional view of a stacked photovoltaic device comprising a plurality of p-i-n type cells, each layer of the cells formed from a disordered semiconductor alloy.

Referring now to the drawings and particularly to FIG. 1, a photovoltaic cell formed of a plurality of successive p-i-n layers, each of which includes a semiconductor alloy, is shown generally by the reference numeral 10. The cell 10 includes the lightly doped intrinsic layer of the instant invention, and thus is representative of one type of photoresponsive device in which the instant invention may be advantageously employed.

More particularly, FIG. 1 shows a p-i-n type photovoltaic device such as a solar cell 10 made up of individual p-i-n type cells 12a, 12b, and 12c. Below the lowermost cell 12a is a substrate 11 which also functions as the bottom electrode of the cell 10. The substrate 11 may be formed of a metallic material such as thin stainless steel or aluminum, or it may be formed from a thin electroformed member such as nickel. Alternatively, the substrate 11 may be formed from an insulating material such as glass or synthetic polymers, with an electrically conductive electrode layer formed thereupon. Although certain applications may require the deposition of a thin oxide layer and/or a series of base contacts and/or a reflecting layer upon the substrate prior to the deposition of the semiconductor material, for purposes of this application, the term, "substrate" shall include any such elements added thereto by preliminary processing.

Each of the cells, 12a, 12b, and 12c is fabricated with an amorphous semiconductor body containing at least a silicon or germanium alloy. Each of the semiconductor bodies includes an n-type conductivity semiconductor layer 20a, 20b, and 20c; a lightly doped intrinsic semiconductor layer 18a, 18b and 18c in accordance with the principles of the instant invention; and a p-type conductivity semiconductor layer 16a, 16b, and 16c. The p-layer 16, and the n layer 20, of each cell 12a, 12b, and 12c cooperate to establish a field across the intrinsic layer 18 thus providing a photoactive region in at least a portion thereof, in which electrons and holes formed by the absorption of light are separated for collection.

It is to be understood that following the deposition of the layers of semiconductor material, a further deposition process may be either performed in a separate environment or as a part of a continuous process. In this step, a TCO (transparent conductive oxide) layer 22, formed in the preferred embodiment of indium tin oxide, also referred to herein as the top or upper electrode, is deposited atop the uppermost layer of semiconductor material. An electrode grid 24 may be applied to the device where the cell is of a sufficiently large area, or if the conductivity of the TCO layer 22 is insufficient. The grid 24 shortens the charge carrier path though the TCO and thus increases the collection efficiency.

While the photovoltaic cell illustrated in FIG. 1 is a stacked assembly of p-i-n cells, it should be apparent that the instant invention may also be employed with other cell arrangements such as single p-i-n cells, or stacked or single n-i-p or p-n cells.

II. The Improved Material

Applicants have analytically and experimentally discovered that the incorporation of small amounts of specifically selected annealing temperature reducing materials, such as, for example, p-dopant materials into a host matrix of an intrinsic amorphous semiconductor alloy material results in a reduction in the temperature at which light induced defects in the band gap thereof may be annealed out of that semiconductor alloy material. It must be stressed that the reduction of the annealing temperature necessary to remove defect states represents a change in the semiconductor alloy material itself, that is to say, the ability to remove defects by low temperature annealing is independent of any particular device configuration in which the semiconductor alloy material may be utilized. Therefore, the improved semiconductor alloy material of the instant invention may be incorporated in a wide variety of photoresponsive devices, such as the tandem p-i-n type photovoltaic device described with reference to FIG. 1.

The improved, low temperature annealable semiconductor alloy material of the instant invention may be prepared by any process adapted for the deposition of high quality amorphous semiconductor alloys, the only additional process step required being the incorporation of small amounts of the appropriate annealing temperature reducing material therein. For example, deposition of the semiconductor alloy may be accomplished by sputtering, in which case the annealing temperature reducing material may be either present in solid form in the sputtering target, or introduced into the atmosphere in the deposition chamber in gaseous form. If introduced in an evaporation process, the annealing temperature reducing material is either added to the solid material being evaporated or added to the residual atmosphere in the deposition chamber. If chemical vapor deposition is employed for the fabrication of the semiconductor alloy, the annealing temperature reducing material is preferably added to the process gas stream. In an electroplating process, which processes are also employed for the fabrication of amorphous semiconductor alloys, an appropriate amount of annealing temperature reducing material is either added to the electrode from which the plated deposit is formed or is added directly into the plating bath.

More importantly, glow discharge deposition processes are most commonly employed for the fabrication of thin film amorphous semiconductor alloys, said processes capable of being readily adapted to incorporate an annealing temperature reducing material into the deposited layer of semiconductor alloy material by the addition of said annealing temperature reducing material into the process gas stream. It should be apparent from the foregoing that the wide variety of techniques routinely employed for the deposition of amorphous semiconductor alloy material, are readily adaptable for the fabrication of low annealing temperature amorphous semiconductor alloys according to the principles espoused herein. Essentially, any technique which can be utilized for the introduction of atoms of dopant materials into a depositing or deposited layers of amorphous semiconductor alloy material may be employed to add an annealing temperature reducing material thereinto. For example, even previously deposited layers of amorphous semiconductor alloy material may have an annealing temperature reducing material introduced into the matrix thereof by processes such as ion implantation, post deposition treatment in an activated atmosphere of the annealing temperature reducing material, a diffusion process, etc. The essence of the method of the instant invention is limited only by the fabrication of a low temperature annealable amorphous semiconductor alloy material by the incorporation of small amounts of an annealing temperature reducing material therein and not by the exact manner in which that annealing temperature reducing material is incorporated.

With the foregoing explanation clearly established, the instant invention will now be explained with reference to the preparation of an intrinsic amorphous silicon:hydrogen alloy specifically characterized by its low temperature annealing properties. This intrinsic alloy is generally similar to that utilized in the i-layers, 18a, 18b and 18c of the photovoltaic device 10 previously described with reference to FIG. 1.

A series of layers of an amorphous silicon:hydrogen alloy were prepared by the glow discharge decomposition of silane utilizing radio frequency energy of 13.56 megaHertz. The decomposition of which was carried out in a deposition chamber maintained at a pressure of approximately 0.2 torr resulted in the deposition of a layer of an amorphous silicon:hydrogen alloy onto a substrate maintained at a temperature of 250° C. A series of samples of a layer of an amorphous silicon:hydrogen alloy incorporating various levels of boron were prepared by adding differing small amounts of diborane to the samples as the non-doped alloys were being deposited. The samples, thus obtained, were then evaluated with regard to the ability of the resultant amorphous silicon:hydrogen:boron alloys to have light induced defects annealed therefrom.

Prior to said evaluation, each of the samples was annealed at 200° C. for a period of two hours. This relatively long, high temperature, annealing process is used to remove any defects occasioned during the handling or preparation of the samples and thus establishes a base line for the comparison thereof. The high temperature annealed samples were then photodegraded by exposure to a white light flux of approximately 100 $MW/cm^2$ for 2 hours. Photoconductivity of the degraded samples was then measured, the samples were next annealed at 100° C. for 15 minutes and the photoconductivity thereof measured once again.

Samples of intrinsic amorphous silicon:hydrogen alloys prepared according to the foregoing process have a band gap of approximately 1.8 eV with the Fermi level thereof located approximately 1.1 eV from the valence band (i.e., 0.7 eV from the conduction band), and therefore, such intrinsic alloys may be regarded as being slightly n-type. The results showed that the annealing of such n-type samples at 100° C. for 15 minutes has virtually no effect upon light induced defects formed in the band gaps of the intrinsic material thereof, (as will become evident from a review of the data presented hereinbelow). Applicants have found that the incorporation of a p-dopant material, particularly boron, in amounts sufficient to shift the Fermi level of the intrinsic semiconductor alloy material toward the valence band (thereby making the intrinsic material slightly p-type) results in an improvement in the annealing characteristics. In accordance with the principles disclosed herein, it has generally been found advantageous to shift the Fermi level of the intrinsic alloy material to within 0.5 to 0.9 eV of the valence band. More specifically, for an amorphous silicon:hydrogen alloy which incorporates boron as the annealing temperature reducing material, it was found that the Fermi level was shifted to a new position approximately 0.7 eV from the valence band so as to produce a novel amorphous semiconductor alloy material from which light induced defects may be annealed by the application of a temperature of only approximately 100° C. for only approximately 15 minutes.

Data from four of the abovementioned samples of semiconductor alloy material, each sample having a different level of boron therein, was collected and is summarized in TABLE I found hereinbelow. In the first column, the amount of diborane gas relative to the amount of silane gas present in the process gas stream is given in parts per million. It should be noted that this number does not reflect the amount of boron actually incorporated into the deposited semiconductor alloy material since the actual amount of boron incorporated is dependent upon the geometry and efficiency of the particular deposition system. Generally, the amount of boron actually incorporated into the deposited material is very small and thus difficult to measure. Column 2 of TABLE I indicates the activation energy, in electron volts (eV), for each sample, and thus provides a precise basis for comparing the relative amounts of boron incorporated into the samples. Samples 1, 2, and 3 are slightly p-type, while sample 4 is very slightly n-type. The third column of TABLE I expresses the ratio of the photoconductivity of the photodegraded silicon alloy material ($sigma_{phB}$) to the photoconductivity of the base line silicon alloy material ($sigma_{phA}$) which was annealed at 200° C. Finally, the fourth column of TABLE I expresses the ratio of the photoconductivity of the photodegraded, and subsequently low temperature annealed sample of silicon alloy material ($sigma_{phC}$) to the photoconductivity of the base line annealed sample ($sigma_{phA}$). Column 3 is thus a measure of the degree of photodegradation occurring in the sample after light soaking (exposure to illumination of AM1 intensity) and column 4 represents a measure of the recovery of that sample of silicon alloy material after the annealing thereof at 100° C. for 15 minutes. It should thus be apparent that the larger the number in Column 3, the lower the degree of photodegradation of the sample, and the larger the number in Column 4, the greater the recovery of the sample after annealing same.

The photoconductivity data represented in TABLE I was obtained for samples deposited on Corning 7059 glass substrates, and was measured in the coplanar direction (i.e. parallel to the layer of silicon alloy), using colloidal graphite electrical contacts spaced approximately 2 mm apart. A constant voltage of approximately 100 v was applied to the sample, and the flow of current therethrough was measured as a function of the intensity of illumination, and the photoconductivity data derived therefrom.

TABLE I

| Sample # | $B_2H_6$/ $SiH_4$ (ppm) | $E_{a(ev)}$ | $sigma_{phB}$/ $sigma_{phA}$ | $sigma_{phC}$/ $sigma_{phA}$ |
|---|---|---|---|---|
| 1 | 67 | .77 | .10 | .9 |
| 2 | 200 | .70 | .67 | 1.0 |
| 3 | 600 | .64 | .79 | 1.0 |
| 4 | 10 | 1.08 | .10 | .24 |

It will be noted from an inspection of TABLE I that the low temperature annealing of the instant invention restores the slightly p-doped, photodegraded samples (i.e. samples 1, 2 and 3) to essentially, the initial base line performance thereof. Sample 4, which includes only very small amounts of boron therein and which is therefore still slightly n-type, recovers only 24% of the predegradation photoconductivity thereof following the same brief, low temperature annealing process which substantially restored Samples 1-3.

Figure 3:
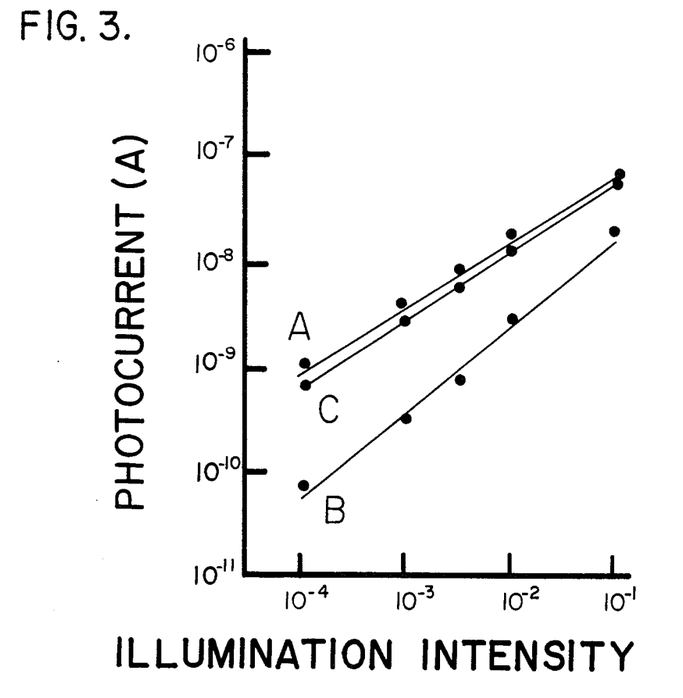
FIG. 3 is a graphic representation of photoconductivity data obtained under various conditions for a sample of semiconductor material fabricated in accord with the principles of the instant invention, as measured parallel to the layer direction and illustrating the improvement resultant from the instant invention.

FIG. 3 is a graphic representation of the photoconductivity data taken from Sample 1 of TABLE I and is illustrative of the recovery of photoconductivity exhibited by a photodegraded amorphous semiconductor alloy material which includes the low temperature annealing material of the instant invention after a brief low temperatu annealing process. As previously described, Sample 1, which an amorphous silicon:hydrogen alloy material doped with a sufficient amount of boron to move the Fermi Level thereof to within approximately 0.75 eV of the valence band, was deposited upon a glass substrate, and contacted by two dots of colloidal graphite spaced approximately 2 mm apart. A constant voltage of approximately 100 volts was applied to the sample via the contacts and it was exposed to varying intensities of illumination while the photocurrent passing therethrough was measured. Curve A depicts the electrical performance of Sample 1 following a high temperature annealing process (2 hours at 200° C.); it is assumed that the samples, thus annealed, have all the annealable defects removed therefrom. Accordingly, Curve A provides the base line for the sample. Curve B represents the characteristic photoconductivity of the silicon alloy material after photodegradation (i.e., white light illumination of 100 mw/cm² for 2 hours). Curve C represents the photoconductivity of the same sample following a 15 minute annealing treatment at 100° C. As is obvious from the foregoing description and the graph of FIG. 3, a brief low-temperature annealing process restores the silicon alloy material to approximately the base line performance thereof.

Figure 2:
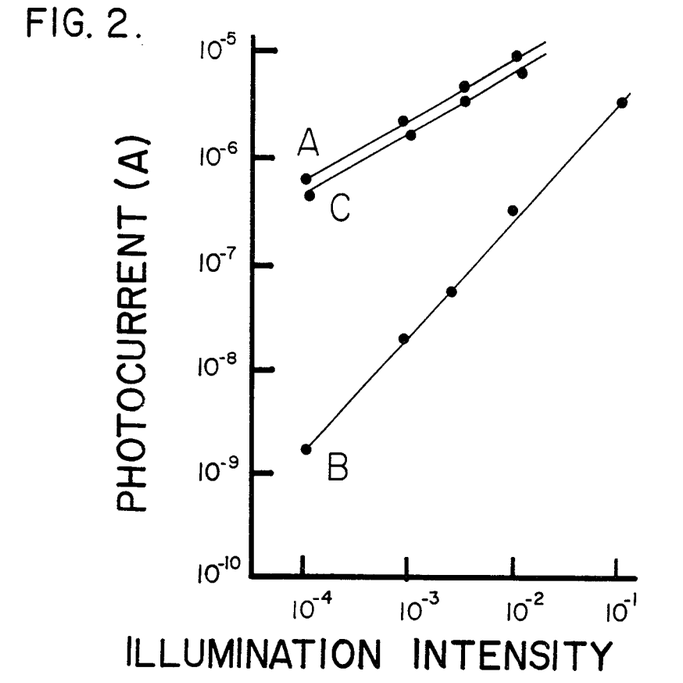
FIG. 2 is a graphic representation of photoconductivity data obtained under various conditions for a sample of semiconductor material fabricated in accord with the prinicples of the instant invention, as measured perpendicular to the layer direction and illustrating the improvement resultant from the instant invention.

FIG. 2 is a graphic representation similar to that of FIG. 3 for the same sample, although, in this case, the photoconductivity was measured in a direction perpendicular to the plane of the deposited layer of silicon alloy material, i.e., the sandwich direction. The sandwich structure was obtained by depositing a 500 angstrom thick layer of p+ (i.e., heavily p doped) silicon on a chromium coated Corning 7059 glass substrate, followed by the deposition of 1.5μ of the silicon alloy being evaluated and another 500 angstrom thick p+ layer. Ohmic contact was thus established to the test sample by the chromium bottom layer and the top p+ layer. A constant voltage of approximately 0.2 volts was applied, and photoconductivity measured as for the preceeding. The photoconductivity was measured in the sandwich direction to conclusively demonstrate that the improved annealing characteristics represent anisotropic material properties and do not depend upon any particular device configuration. It will be noted from an inspection of FIG. 3 that the electrical performance of the sample, as measured in the layer direction, and without any extraneous semiconductor alloy layers present, is generally similar to the electrical performance measured in the stack direction (as depicted in FIG. 2). While the overall photocurrent passed through the sample depicted in FIG. 3 is lower that of FIG. 2, owing to the longer path which the current was forced to traverse, the magnitude of the change in photocurrent upon degradation and annealing is similar.

It may thus be seen that the instant invention can be employed to provide a photovoltaic quality semiconductor alloy material from which photoinduced defects may be quickly removed by a low temperature annealing process. It should further be obvious that such lowered annealing temperatures are readily attainable during operation of the photovoltaic device itself. If a photovoltaic device structured in accordance with the principles of the instant invention were exposed to a temperature of approximately 100° C. for a period of time as short as 15 minutes and at intervals of once or twice a year during operation, the photoinduced defects would be virtually eliminated from the band gap of the semiconductor material thereof. To achieve similar performance (removal of defects) utilizing prior art photovoltaic devices, temperatures in the neighborhood of approximately 200° C. would have to be obtained and maintained for periods of several hours.

III. The Hot Module

The low temperature annealable photovoltaic devices of the instant invention may be incorporated into modules specifically designed to attain and maintain elevated temperatures during the operational life thereof so as to anneal defects from the band gap of the semiconductor material thereof. These annealing operations may be performed on a periodic basis, i.e., occasional hot sunny days may be relied upon to raise the semiconductor material of a photovoltaic device to the annealing temperature for a period of time sufficient to substantially remove defects which have accumulated during the previous operation of said device. Alternatively, a continuous annealing process may be employed. In such a continuous process, the semiconductor material is constantly maintained at a somewhat lower annealing temperature during a significant portion of the operational time of the photovoltaic device. Numerous techniques and apparatus for utilizing the radiant portion of the incident solar spectrum as a source of heat are available and may be readily adapted to provide thermal energy to the low temperature annealable photovoltaic devices of the instant invention.

Figure 4:
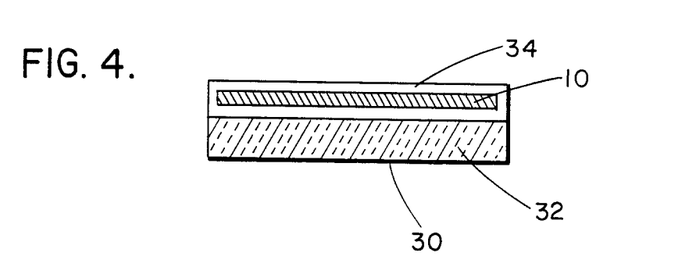
FIGS. 4 and 5 are cross-sectional views of respective first and second photovoltaic modules designed to attain and maintain an elevated temperature during at least a portion of the time of its operation and embodying a low temperature annealable photovoltaic material.

Referring now to FIG. 4, a photovoltaic module designed to attain the elevated operating temperatures necessary to anneal defects from the semiconductor material hereof is shown generally by the reference numeral 30. The hot module 30 includes a photovoltaic device 10 which, for purposes of this illustration is generally similar to the photovoltaic device 10 depicted in and described with reference to FIG. 1, although it must be understood that other photovoltaic devices embodying the principles of the instant invention set forth herein may also be advantageously used. The hot module 30 further includes a base or backing member 32 which underlies the photovoltaic device 10, and an encapsulant 34 which forms a substantially air-tight seal between the photovoltaic device 10 and the backing member 32. The backing member 32 is formed from a thermally insulating material having a thermal conductivity of less than $10^{-3}$ W/cm °C. such as, for example, glass, wool, styrofoam, cork, etc. The backing member 32 underlies the photovoltaic device 10 and contacts and adheres to the encapsulant 34 so as to be in broad surface area contact therewith.

The encapsulant 34 is preferably formed from a transparent, polymeric material such as Tedlar (registered trademark of Dupont), said encapsulant applied so as to totally encapsulate the photovoltaic device 10 for protecting same from the effects of ambient conditions and for preventing the loss of heat. Because the encapsulant 34 is transparent, photons of incident radiation pass therethrough for absorption in the photoactive regions of the semiconductor material of the photovoltaic device 10, thereby generating charge carriers. In operation, when the hot module 30 is exposed to incident light, the photovoltaic device 10 thereof absorbs light energy to produce electrical energy (in the manner previously described) and heat. The heat generated by the photovoltaic device 10 cannot be conducted away from the device 10 due to the presence of the thermal insulating backing member 32 and the encapsulant 34. As a result, the photovoltaic device 10 attains and maintains an elevated temperature (above the ambient temperature) during the operation thereof, thereby permitting low temperature annealing to occur.

Figure 5:
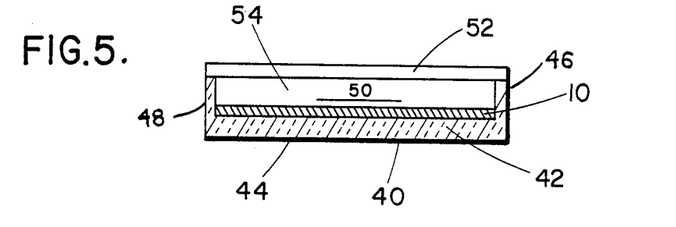

Referring now to FIG. 5, another preferred embodiment of a hot module, structured in accordance with the principles of the present invention, is indicated generally by the reference numeral 40. The hot module 40 includes a photovoltaic device 10, generally similar to that depicted and described with respect to FIG. 3. The hot module 40 further includes an enclosure 42 which is formed by a bottom wall 44, four side walls, only three of which, 46, 48, and 50, are illustrated, and a transparent cover 52.

The photovoltaic device enclosure 42 is either formed from, or contains, a thermal insulating material such as glass, wool, styrofoam, cork, etc. and is dimensioned to receive and retain the photovoltaic device 10 interiorly thereof and in surface contact therewith. The side walls 46, 48, and 50 of the enclosure 42 extend upwardly from the bottom wall thereof by a distance sufficient to form an air space 54 between the front surface of the photovoltaic device 10 and the transparent cover 52, said cover 52 bridging across the side walls of the enclosure so as to fully encapsulate the device 10. The transparent cover 52 can be formed from glass or other similar rigid or semirigid transparent material which is affixed to the top surfaces of the side walls by a suitable adhesive such as epoxy.

In operation, incident light energy which passes through the transparent cover 52 strikes the front surface of the photovoltaic device 10, the semiconductor material of which device 10 absorbs the light energy and produces electrical energy and heat therefrom. The thermal energy produced in the enclosure 42 is prevented from being conducted away from the photovoltaic device 10 by the thermal insulating backing member 32 and the air space 54 incorporated therein. In this manner, the photovoltaic device 10 is maintained at a sufficiently elevated operating temperature to provide for the low temperature annealing thereof.

Because of the fact that photovoltaic devices fabricated in accordance with the principles of the instant invention are capable of having defects annealed therefrom at substantially reduced temperatures, hot module design (utilizing the materials described herein as opposed to previously employed materials) becomes greatly simplified. Reduced quantities of insulation are required to achieve the reduced annealing temperatures, thereby making the modules lighter and more economical (and hence, more commercially viable). Depending upon the location of the photovoltaic installation, ambient temperatures, in and of themselves, will be sufficient to anneal the photoinduced defects from the semiconductor material of the photovoltaic device while said device is operational. For example, if a photovoltaic device, fabricated in the manner described hereinabove, were deployed in a tropical or subtropical environment, especially on a roof-top location, operating temperatures in excess of 60° C. would be readily attainable and the defects would be constantly annealed therefrom.

In other cases, operating temperatures, elevated to a level sufficient to anneal defects from the photovoltaic device are readily attained by simply enclosing the entire photovoltaic device in a relatively thick layer of encapsulant material characterized by a high degree of optical transparency and relatively low thermal conductivity. Among such materials are various silicones, synthetic organic resins, inorganic glasses, and the like. A photovoltaic device enveloped in a transparent relatively thick layer of encapsulating material may attain a temperature sufficient to allow the annealing process to proceed, while limiting cooling effects due to conduction and convection to the region proximate the surface of the thick encapsulant layer. Obviously, many other module designs fall within the spirit and the scope of the instant invention.

IV. The Electrically Heated Device

Rather than relying solely upon solar thermal energy to heat and anneal the light induced defects formed in the semiconductor material of a photovoltaic device, it may be desirable in some cases to utilize electrical heating to perform the annealing operation. Owing to the low temperature at which the semiconductor material may be annealed according to the principles of the instant invention (when boron is introduced into the matrix of semiconductor material), electrical heating becomes a feasible method for restoring the semiconductor material of such photovoltaic devices to their predegraded condition.

Many types of radiant and resistive electrical heaters are commercially available, such heaters being readily utilizable in conjunction with the low temperature annealable photovoltaic device described herein. Periodic energization of the electrical heater may be provided for from a source of electrical energy, whether that energy is produced by the photovoltaic device, itself, and stored in a battery or whether the energy is supplied by an external source. Obviously, if the photovoltaic assembly is connected to an external source, such as an electrical grid system, storage means (a battery) is not necessary, but rather, power from the grid may be channeled directly through the heater to effect the annealing process.

Figure 6:
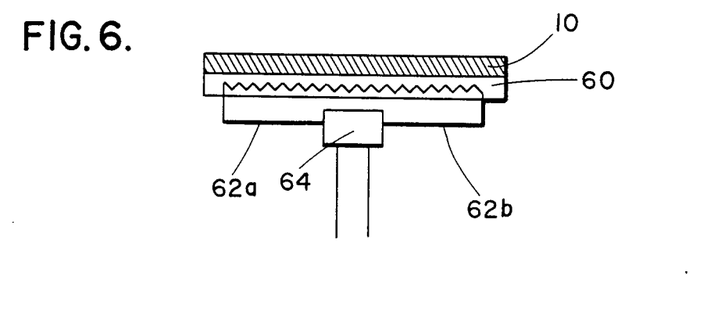
FIG. 6 is a cross-sectional view of an electrically heated photovoltaic module designed to attain and maintain an elevated temperature during at least a portion of the time of its operation and embodying a low temperature annealable photovoltaic material.

FIG. 6 illustrates still another preferred embodiment of the instant invention. In the FIG. 6 embodiment, an electrical resistance heater 60 is utilized to anneal a photovoltaic cell 10. The cell 10 is, for purposes of this illustration, generally similar to the cell 10 depicted and described with reference to FIG. 1. However, the cell 10 has a relatively thin, sheet-like electrical heater 60 attached to the rear surface thereof. One such heater, specifically utilizable in the practice of the instant invention, is a Thermofoil brand heater manufactured by Minco Products, Inc. of Minneapolis, Minn. In an alternate preferred embodiment, a resistance heating element may be deposited directly upon the back surface of the substrate of the photovoltaic cell 10 by techniques such as screen printing or evaporation.

The electrical heater 60 includes a pair of electrical leads 62a and 62b for supplying the electrical energy thereto. Although manual energization and control of the heater 60 is satisfactory, it is desirable to effect the energization of the heater through leads 62a, 62b by supplying a controller 64 which is adapted to regulate the intensity, duration and frequency of application of heat to the photovoltaic cell 10. The controller 64 may be adapted to periodically energize the heater 60 at spaced, but fixed, intervals; alternatively, the controller 64 may be adapted to integrate either the electrical output from the cell 10, or the illumination incident thereupon, and thereby energize the electrical heater 60 in response to specific periods of elapsed time during which the photovoltaic cell 10 has been operational. In other words, the degree of photodegradation, being dependent upon the length and intensity of operation of the cell 10, is a factor which can be taken into account in a restoration equation, and the heater 60 activated only when necessary to restore the electric conversion efficiency thereof.

Continuous annealing may also be implemented in a resistively heated photovoltaic device. In such an embodiment, electrical energy may be constantly trickled to the heater so as to continuously maintain the photovoltaic device at its elevated annealing temperature, the temperature at which defects in the band gap of the photoactive region of the semiconductor material of which will be annealed almost upon the formation thereof.

Obviously, the concepts of electrical heating and hot module design are not mutually exclusive. That is to say, the two heating techniques may be used in conjunction with one another. For example, in a photovoltaic installation where ambient temperature and/or windchill conditions make it difficult to attain and maintain the desired annealing temperature in a passively heated hot module, a small resistance heater may be employed to provide sufficient additional warmth to the photovoltaic device to anneal the defects from the semiconductor material thereof. It should be noted that while the foregoing discussion was primarily concerned with photovoltaic devices, the principles of the instant invention may also be advantageously applied to other types of photoresponsive devices such as phototransistors, photodiodes, photodetectors, or any other semiconductor device, whether or not photoresponsive, which is prone to form defects in response to the absorption of photons.

Many variations and modifications are possible without departing from the spirit or scope of the instant invention. The foregoing explanation, drawings and descriptions are merely meant to be illustrative of the broad principles of the instant invention, and not as a limitation upon the practice thereof. It is the following claims, including all equivalents thereof, which define the scope of the instant invention.

What is claimed is:

1. In a photoresponsive semiconductor device of the type which (1) generates electron-hole pairs in an intrinsic type photoactive region thereof in response to incident light; (2) separates and collects the electrons and holes; (3) develops light induced defects tending to deleteriously affect collection efficiency; and (4) is capable of having substantial numbers of said light induced defects removed by annealing said device at elevated temperatures; the improvement comprising in combination:

p-dopant means incorporated into at least a portion of the photoactive region for reducing the temperature at which said substantial number of light induced defects can be annealed out of the photoresponsive device to a temperature below the annealing temperature of material without the p-dopant means; and, means for maintaining said photoresponsive device at said reduced annealing temperature for at least a portion of its operational lifetime, said temperature maintaining means including means for preventing loss of heat from said device; whereby light induced defects are at least periodically annealed out of the photoresponsive device during the operation thereof, so as to provide a photoresponsive device characterized by a relatively stable collection efficiency.

2. A photoresponsive device as in claim 1, wherein said temperature maintaining means further comprises an electric heater.

3. A photoresponsive device as in claim 1, wherein said temperature maintaining means comprises a portion of said photoresponsive device which is adapted to receive radiant solar energy and convert said energy to heat.

4. A photoresponsive device as in claim 1, wherein said temperature maintaining means comprises an enclosure for housing said photoresponsive device, said enclosure being (1) at least partially transparent to solar radiation, and (2) thermally insulated so as to prevent loss of heat from the interior of said enclosure and from said device.

5. A photoresponsive device as in claim 1, wherein said device includes at least one triad of semiconductor layers, each triad comprised of a layer of intrinsic semiconductor material, a layer of p-type semiconductor material disposed in electrical contact with a first surface of the layer of intrinsic semiconductor material and a layer of n-type semiconductor material disposed in electrical contact with a second surface of the layer of intrinsic semiconductor material, the layers cooperating to provide said photoactive region in the intrinsic semiconductor layer of each of said at least one triad.

6. A photoresponsive device as in claim 5, wherein said p-dopant means comprises a p-dopant incorporated into at least a portion of the intrinsic layer of at least one of said at least one triad of layers.

7. A photoresponsive device as in claim 6, wherein said p-dopant material is present in the intrinsic semiconductor layer in a lesser amount than in the corresponding p-type semiconductor layer.

8. A photoresponsive device as in claim 7, wherein the intrinsic semiconductor layer is formed of an alloy which includes at least silicon therein, and said p-dopant material is chosen from the group consisting essentially of: Boron, Aluminum, Gallium, Indium, Thallium, and combinations thereof.

9. A photoresponsive device as in claim 8, wherein said p-dopant material is present in the intrinsic semiconductor layer in an amount sufficient to move the Fermi level of said intrinsic semiconductor layer to a position approximately 0.5 to 0.9 electron volts from the valence band thereof.

10. A photoresponsive device as in claim 5, wherein said temperature maintaining means is adapted to maintain the photoresponsive device at a temperature of approximately at least 60° C. for at least a portion of its operational lifetime.

11. A photoresponsive device as in claim 5, wherein said temperature maintaining means comprises an electric heater.

12. A photoresponsive device as in claim 11, wherein said temperature maintaining means further comprises a source of electrical power and means for periodically energizing the electric heater from the source of electrical power.

13. A photoresponsive device as in claim 5, wherein said temperature maintaining means comprises a portion of said photoresponsive device which is adapted to receive radiant solar energy and convert said radiant energy to heat.

14. A photoresponsive device as in claim 13, having thermal transfer inhibiting means associated therewith for said preventing loss of heat from said photoresponsive device.

15. A photoresponsive device as in claim 5, wherein said temperature maintaining means comprises an enclosure for housing said photoresponsive device, said enclosure being (1) at least partially transparent to solar radiation, and (2) thermally insulated so as to prevent loss of heat from the interior thereof.

16. A method of fabricating a photoresponsive semiconductor device of the type which (1) generates electron-hole pairs in an intrinsic type photoactive region thereof in response to incident light; (2) separates and collects the electrons and holes; (3) develops light induced defects tending to deleteriously affect collection efficiency; and (4) is capable of removing substantial numbers of said light induced defects by annealing said device at elevated temperatures; the method including the steps of:
   providing p-dopant means incorporated into at least a portion of the photoactive region for reducing the temperature at which said substantial number of light induced defects can be annealed out of the photoresponsive device to a temperature below the annealing temperature of material without the p-dopant means; and,
   providing means for maintaining said photoresponsive device at said reduced annealing temperature for at least a portion of its operational lifetime, said temperature maintaining means including means for preventing loss of heat from said device; whereby light induced defects are at least periodically annealed out of the photoresponsive device during the operation thereof, so as to provide a photoresponsive device characterized by a relatively stable collection efficiency.

17. A method as in claim 16, wherein the step of providing temperature maintaining means comprises the further step of providing an electric heater.

18. A method as in claim 16, wherein the step of providing temperature maintaining means comprises the further step of adapting a portion of said photoresponsive device to receive radiant solar energy and convert said energy to heat.

19. A method as in claim 16, wherein the step of providing temperature maintaining means comprises the further step of providing an enclosure for housing said photoresponsive device, said enclosure being (1) at least partially transparent to solar radiation and (2) thermally insulated so as to prevent loss of heat from the interior of said enclosure and from said device.

20. A method as in claim 16, wherein said device includes at least one triad of semiconductor layers, each triad comprised of a layer of intrinsic semiconductor material, a layer of p-type semiconductor material disposed in electrical contact with a first surface of the layer of intrinsic semiconductor material and a layer of n-type semiconductor material disposed in electrical contact with a second surface of the layer of intrinsic semiconductor material, the layers cooperating to provide said photoactive region in the intrinsic semiconductor layer of each of said at least one triad; wherein the step of providing p-dopant means comprises the further step of:

providing an intrinsic semiconductor layer in at least one of said triads incorporating a p-dopant material therein.

21. A method as in claim 20, wherein the step of providing an intrinsic layer having a p-dopant material comprises the further step of providing said dopant material incorporated into the intrinsic semiconductor layer in a lesser amount than in the p-type semiconductor layer.

22. A method as in claim 21, wherein the step of providing an intrinsic layer having a p-dopant material therein comprises the further step of depositing an intrinsic layer formed of an alloy which includes at least silicon and a p-dopant material chosen from the group consisting essentially of: Boron, Aluminum, Gallium, Indium, Thallium, and combinations thereof.

23. A method as in claim 22, wherein the step of depositing an intrinsic layer comprises the further step of depositing a silicon alloy wherein said p-dopant material is present in an amount sufficient to move the Fermi level of said intrinsic layer to a position approximately 0.5 to 0.9 electron volts from the valence band thereof.

24. A method as in claim 21, wherein the step of providing temperature maintaining means comprises the further step of providing temperature maintaining means adapted to maintain the photoresponsive device at a temperature of at least 60° C. for at least a portion of its operational lifetime.

25. A method as in claim 21, wherein the step of providing temperature maintaining means comprises the further step of providing an electric heater.

26. A method as in claim 25, wherein the step of providing said temperature maintaining means further comprises the steps of providing a source of electrical power and means for periodically energizing the electric heater from the source of electrical power.

27. A method as in claim 20, wherein the step of providing temperature maintaining means comprises the further step of adapting a portion of said photoresponsive device to receive radiant solar energy and convert said radiant energy to heat.

28. A method as in claim 27, wherein the step of providing temperature maintaining means comprises the further step of providing thermal transfer inhibiting means associated with the photoresponsive device for said preventing loss of heat from said device.

29. A method as in claim 20, wherein the step of providing temperature maintaining means comprises the further step of providing an enclosure for housing said photoresponsive device, said enclosure being (1) at least partially transparent to solar radiation and (2) thermally insulated so as to prevent loss of heat from the interior of said enclosure.

* * * * *